United States Patent [19]
Chabert et al.

[11] Patent Number: 5,694,298
[45] Date of Patent: Dec. 2, 1997

[54] PROGRAMMABLE CONTROLLER

[75] Inventors: Jean-Marie Chabert, Valbonne; Alex Portal, Biot, both of France

[73] Assignee: AEG Schneider Automation, Valbonne, France

[21] Appl. No.: 688,096

[22] Filed: Jul. 29, 1996

[51] Int. Cl.[6] ............................................. H05K 7/14
[52] U.S. Cl. ...................... 361/798; 361/754; 361/801; 439/157; 439/160
[58] Field of Search .................................. 361/727, 725, 361/798, 728, 796, 787, 737, 730, 754, 756, 741, 802, 801, 732, 726, 759; 439/152, 153, 157, 159, 160

[56] References Cited

FOREIGN PATENT DOCUMENTS 2 316 834   1/1977   France .
30 13 517  10/1981   Germany .

*Primary Examiner*—Leo P. Picard
*Assistant Examiner*—Anthony Dinkins
*Attorney, Agent, or Firm*—Oblon, Spivak, McClelland, Maier & Neustadt, P.C.

[57] ABSTRACT

An electronic device for inserting an electronic card. The device has a fixed housing with a slot at the back for a connector and a slot at the front for engaging the card. A gripping device carries the electronic card. The gripping device includes a receptacle into which the card is inserted at its front end, with the back of the receptacle covering the card insertion slot. The gripping device also cooperates with an extraction device placed along the card. The extraction device includes a shoulder that comes into contact with the back end of the card to extract the card.

9 Claims, 2 Drawing Sheets

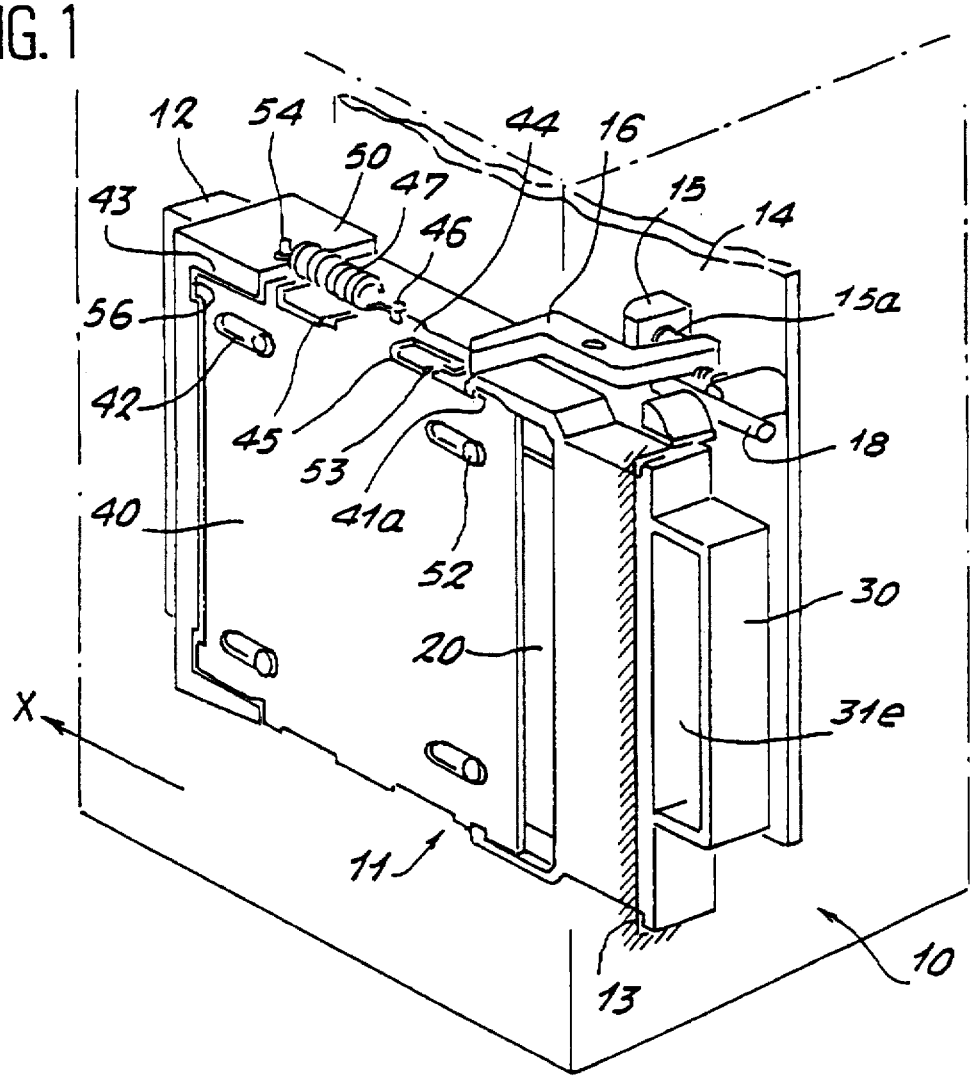

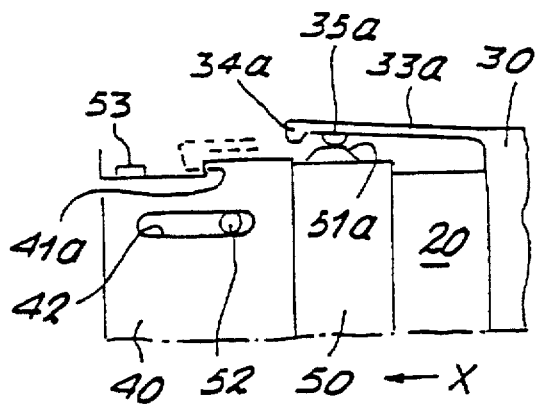
FIG. 3
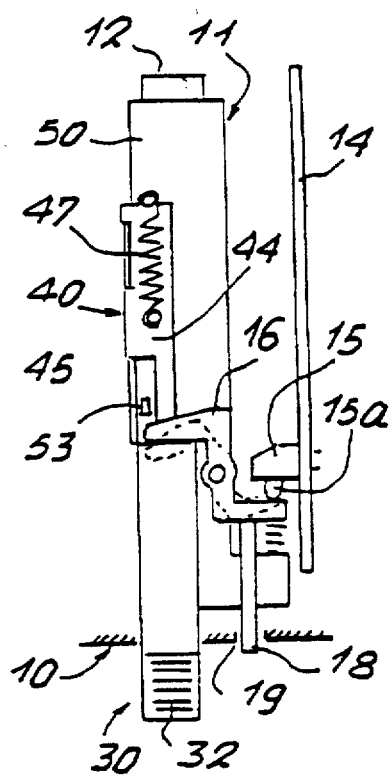
FIG. 4
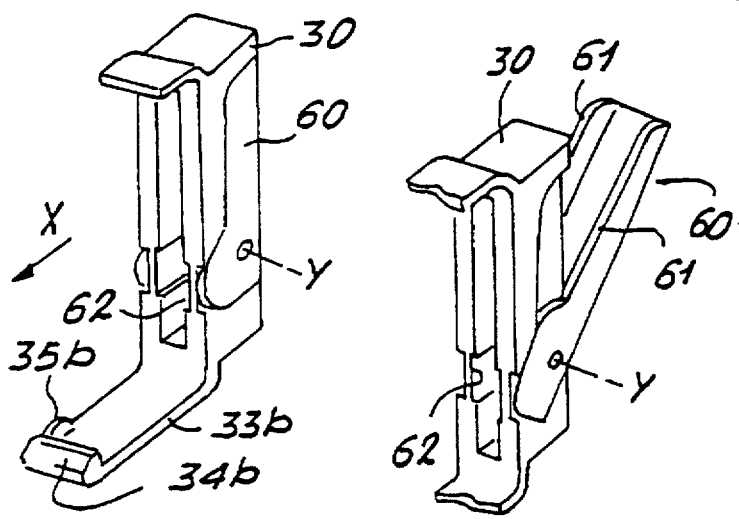
FIG. 5
FIG. 6
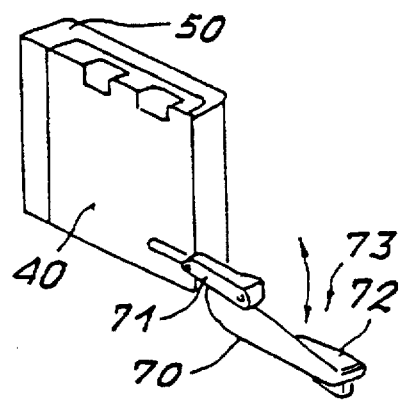
FIG. 8
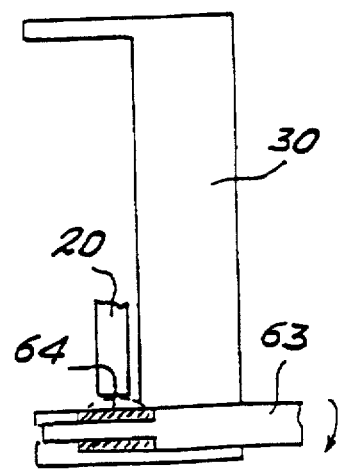
FIG. 7

PROGRAMMABLE CONTROLLER

This invention concerns electronic equipment consisting of a body and a device for inserting and extracting an electronic card such as a memory card inside and outside the body.

Memory cards, particularly PCMCIA type cards, are usually inserted into a slot in the front of the equipment so that it slides into a housing in the body and fits into a fixed connector located at the back of the housing.

It is then necessary to provide an extraction device which must work in cooperation with the rear edge of the card, since the card does not project in any way. Existing devices have the disadvantage that they leave the card accessible even after it has been inserted, and they do not satisfactorily protect the card when they are used in an industrial environment, and therefore do not protect the appliance against electrostatic discharges from the outside.

The purpose of the invention is to facilitate inserting and extracting an electronic card such as a memory card into an electronic device, while satisfactorily protecting the card against electrostatic discharges.

According to the invention, the device comprises an insertion and extraction gripping device which holds the removable electronic card; the gripping device includes a receptacle into the front end of which the card is inserted, the bottom of the receptacle covering the slot into which the card is engaged, and the gripping device cooperates with an extraction device placed along the card and which includes a shoulder applied to the back end of the card to extract it.

Therefore, the card can easily be fixed to the gripping device either by soft sleeving, or by clamping means provided in the gripping device, and can be inserted into the body of the unit while being protected against electrostatic discharges from external sources.

It is useful that the gripping device and the extraction device should be guided in translation in the housing, preferably in a guiding frame, and that the gripping device cooperates with the extraction device by means of mutual attachment means engaged during the insertion stroke, and then released during the gripping device extraction stroke. The gripping device may also cooperate with a signaling switch connected to the equipment processing system unit.

The advantages and characteristics of the invention will become clear from the following description of the embodiments of the invention made in reference to the appended drawings.

FIG. 1 shows a perspective view of part of an electronic device according to the invention.

FIG. 2 shows a side elevation of the sub-assembly formed by the gripping device and the memory card.

FIG. 3 shows a detail of the gripping device engagement phase.

FIG. 4 is a top view of the sub-assembly engaged in the body of the device.

FIGS. 5 and 6 show a perspective view of an alternative of the gripping device in two separate operating positions.

FIG. 7 shows a section of another alternative of the gripping device.

FIG. 8 shows a perspective view of another embodiment of the gripping device.

The electronic device shown in FIG. 1 is a programmable controller containing a body, for example a tray, made to house different components and particularly input/output modules. The tray is fitted with a front wall 10 that is accessed by the operator; in the rest of this document, the front and back refer to elements closest to and furthest from the operator respectively.

In order to house a memory card which will contribute to operation of the programmable controller, the tray comprises a short narrow fixed housing 11 which forms a slot at the back for a fixed connector 12 and a vertically aligned slot 13 at the front; this slot shaped opening is used to insert a memory card 20, removably installed in a gripping device 30.

The gripping device 30 is connected by releasable attachment means to a card extraction device; in this embodiment, the device consists of a metal plate 40 which extends in the housing 11 and which is positioned to be mobile in translation along a direction X on a fixed frame 50, which is also installed in housing 11; the plate 40, the gripping device 30 and the card 20 are guided on the frame, as will be seen later.

A printed circuit 14 is placed in the tray parallel to the X direction; there is a switch 15 on this circuit capable of being activated firstly by the gripping device, and secondly by a push switch connected to the controller central unit to send an interrupt resumed operation signal to it. Switch 15 is activated by gripping device 30 by means of inverter lever 16 hinged on a pivot provided in the upper part of frame 50.

The memory card 20, which is of the type known as PCMCIA but may also be of another type, is fitted with a connector 22 at its back end 21, which has to engage in the tray fixed connector 12; at its front end 23, the card is inserted in a receptacle 31 in gripping device 30.

Receptacle 31 has side walls 31a, 31b, and top 31c and bottom 31d walls which conceal the front end 23 of the memory card 20 and form an housing into which the card gradually slides. In this way, the card remains trapped in the gripping device 30, and can be manually withdrawn from the gripping device itself released from the frame, when a slight tension force is exerted on the card. The gripping device 30 has a front face 31e which forms the back of the receptacle 31 and which in the connection position covers the elongated slot 13.

The gripping device 30 comprises a manual gripping device 32, for example a handle, a lever or similar device connected to the front face 31e; it also includes two elastic arms 33a, 33b, each fitted with a ratchet 34a and 34b and a projection 35a and 35b which cooperate with a latching socket 41a, 41b of the extraction plate 40 and with a ramp 51a, 51b on each side of the frame.

Apart from the connectors 41 mentioned above, the extraction plate 40 comprises oblong openings 42 extending along the X direction and cooperating with frame guide pins 52. At its back end, plate 40 contains returns 43 forming shoulders that come into contact with the back end 21 of card 20. At its top and bottom parts, the plate comprises folds 44 which cooperate through scallops 45 with guide shapes 53 in the frame and by means of connectors 41 with pawls 34. The upper fold 44 has a pin 46 to which an end of the tension spring 47 is attached which pulls the plate backwards and another end is attached to point 54 on the frame.

The frame 50 also includes a side wall 55 fitted with pins 52 and a recess 56 to allow plate returns 43 to pass, and top and bottom walls 57. The top wall 57 carries guide shapes 53 and the spring attachment point 54. Ribs or straight guide grooves 58 are provided on the two inside faces of walls 57 for the corresponding elements of gripping device 30 such as flanges 36 (see FIG. 2) and guide ribs or grooves 59 for the memory card 20.

The switch 15 is designed with a control element 15a towards the front, such that it can be activated firstly by the reversing lever 16 to be moved into the open position when the gripping device is engaged (in solid lines in FIG. 4), and in the closed position when the gripping device is extracted (in dashed line in FIG. 4). A push rod 18 accessible through an orifice 19 in the tray front wall 10 is used to press the control element 15a of the switch to reset or restart the programmable controller when the gripping device is engaged.

In the embodiment shown in FIGS. 1 to 4, the gripping device 30 moves in translation along the X direction perpendicular to the tray front face 10, in the same way as plate 40.

In the embodiment shown in FIGS. 5 and 6, gripping device 30 also moves in translation along X, but the means of gripping the card 20 is a lever 60 pivotally fitted about a Y axis perpendicular to the X direction; the lever 60 includes side branches 61 equipped with cams in order to cause part of the side walls 62 of the gripping device to bend along a direction parallel to Y, and thus grip (FIG. 5) or release (FIG. 6) the card.

In the embodiment shown in FIG. 7, the card 20 is gripped in the gripping device 30 by means of a button or a rotary pin 63, which as it moves compresses an elastometer ring 64 in order to exert pressure on the lower edge of the card.

In the embodiment of FIG. 8, the gripping device is a pivoting lever 70 hinged to the frame and connected to the plate 40 through a rod 71, such that the memory card can be manually inserted inside the frame, the lever 70 making or confirming the connection by forcing the bottom 72 of its receptacle 73 into contact with the front edge of the card.

We claim:

1. An electronic device comprising a body and a device for inserting and extracting an electronic card such as a memory card inside and outside the body, the device comprising a fixed housing that forms a slot at the back for a fixed connector associated with the card, and a slot at the front for engagement of the card, characterized in that:
an insertion and extraction gripping device removably carries the electronic card,
the gripping device includes a receptacle into which the card is inserted at its front end, the back of the receptacle covering the card insertion slot in the connection position, and,
the gripping device cooperates with an extraction device placed along the card and which includes a shoulder that comes into contact with the back end of the card to extract the card.

2. A device according to claim 1, characterized in that the gripping device and the extraction device are guided in translation in housing, and the gripping device cooperates with the extraction device of mutual attachment means engaged while the gripping device is being inserted, and released during the gripping device extraction stroke.

3. A device according to claim 2, characterized in that the mutual attachment means include elastic pawls placed on the gripping device and connectors provided on the extraction device, the pawls working in cooperation firstly with the connectors and secondly with fixed release ramps.

4. A device according to claim 1, characterized in that the device comprises a guide frame for the extraction device, this frame forming a support for the extraction device return spring.

5. A device according to claim 4, characterized in that the frame comprises gripping device guide means.

6. A device according to claim 1, characterized in that the electronic card is held in place in the gripping device receptacle, by a soft sleeving.

7. A device according to claim 1, characterized in that the electronic card is held in the gripping device by gripping means.

8. A device according to claim 1, characterized in that the gripping device cooperates with a device operating switch.

9. A device according to claim 8 characterized in that the gripping device acts on switch through a reversing lever, whereas a push button accessible on the front of the device body is placed so as to act directly on this switch.

\* \* \* \* \*